US010764522B2

(12) United States Patent
Tang

(10) Patent No.: US 10,764,522 B2
(45) Date of Patent: *Sep. 1, 2020

(54) IMAGE SENSOR, OUTPUT METHOD, PHASE FOCUSING METHOD, IMAGING DEVICE, AND TERMINAL

(71) Applicant: GUANGDONG OPPO MOBILE TELECOMMUNICATIONS CORP., LTD., Dongguan, Guangdong (CN)

(72) Inventor: Cheng Tang, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/435,555

(22) Filed: Jun. 9, 2019

(65) Prior Publication Data

US 2019/0297288 A1  Sep. 26, 2019

Related U.S. Application Data

(63) Continuation of application No. 15/632,697, filed on Jun. 26, 2017, which is a continuation of application No. PCT/CN2016/101704, filed on Oct. 10, 2016.

(30) Foreign Application Priority Data

Dec. 18, 2015 (CN) .......................... 2015 1 0963242

(51) Int. Cl.
*H04N 5/369* (2011.01)
*H04N 5/225* (2006.01)
(Continued)

(52) U.S. Cl.
CPC ..... *H04N 5/3696* (2013.01); *H01L 27/14621* (2013.01); *H01L 27/14627* (2013.01);
(Continued)

(58) Field of Classification Search
CPC ............... H04N 5/23212; H04N 5/347; H04N 5/36961; H04N 5/232122
See application file for complete search history.

(56) References Cited

U.S. PATENT DOCUMENTS 6,999,119 B1   2/2006 Shibazaki et al.
9,215,389 B2  12/2015 Usui
(Continued)

FOREIGN PATENT DOCUMENTS

CN   102510450   6/2012
CN   103531603   1/2014
(Continued)

OTHER PUBLICATIONS

SIPO, First Office Action for CN Application No. 201510963242, dated Mar. 17, 2017.
(Continued)

*Primary Examiner* — Thanh Luu
(74) *Attorney, Agent, or Firm* — Hodgson Russ LLP

(57) ABSTRACT

The present disclosure discloses a pixel information output method of an image sensor. The image sensor includes a photosensitive unit array including a plurality of photosensitive units, a filter cell array including a plurality of filter cells, and a micro-lens array including a plurality of micro-lenses. The filter cell array is located between the photosensitive unit array and the micro-lens array. Each micro-lens covers a filter cell and a photosensitive unit. Each photosensitive unit includes a plurality of photosensitive pixels. The method includes: determining an output mode according to a mode selection instruction; controlling exposure of the photosensitive unit array and reading outputs of the photosensitive unit array, pixel information of the plurality of photosensitive pixels of a same photosensitive unit being combined to be output when selecting a first output
(Continued)

mode. The present disclosure also discloses a phase focusing method, an image sensor, an imaging device, and a terminal.

7 Claims, 7 Drawing Sheets

(51) Int. Cl.
*H04N 5/347* (2011.01)
*H01L 27/146* (2006.01)
*H04N 5/378* (2011.01)

(52) U.S. Cl.
CPC ............ *H04N 5/225* (2013.01); *H04N 5/347* (2013.01); *H04N 5/378* (2013.01)

(56) References Cited

U.S. PATENT DOCUMENTS

| | | | |
|---|---|---|---|
| 2009/0200451 A1 | 8/2009 | Conners | |
| 2013/0100338 A1 | 4/2013 | Iwasaki | |
| 2014/0204257 A1 | 7/2014 | Wang et al. | |
| 2017/0099449 A1* | 4/2017 | Kang | ................... H04N 5/3765 |
| 2017/0171470 A1* | 6/2017 | Sakioka | ............ H01L 27/14607 |

FOREIGN PATENT DOCUMENTS

| | | |
|---|---|---|
| CN | 103686103 | 3/2014 |
| CN | 103748868 | 4/2014 |
| CN | 104064577 | 9/2014 |
| CN | 104125394 | 10/2014 |
| CN | 104241310 | 12/2014 |
| CN | 105144699 | 12/2015 |
| CN | 105611122 | 5/2016 |
| EP | 2938062 | 10/2015 |
| JP | 2004191630 | 7/2004 |
| JP | 2012507250 | 3/2012 |
| JP | 2014135451 | 7/2014 |
| JP | 2014157338 | 8/2014 |
| TW | 201404132 | 1/2014 |
| WO | 2014200939 | 12/2014 |
| WO | 2015083683 | 6/2015 |

OTHER PUBLICATIONS

SIPO, Second Office Action for CN Application No. 201510963242, dated Jun. 4, 2018.
SIPO, Third Office Action for CN Application No. 201510963242, dated Aug. 17, 2018.
SIPO, Fourth Office Action for CN Application No. 201510963242, dated Nov. 13, 2018.
IPOS, ISR and WO for SG Application No. 11201706245Y, dated Dec. 28, 2017.
WIPO, ISR for PCT/CN2016/101704, dated Dec. 30, 2016.
KIPO, Office Action for KR Application No. 10-2017-7026269, dated Mar. 18, 2019.
EPO, Office Action for EP Application No. 16874631, dated Dec. 8, 2017.
SIPO, Decision of Rejection for CN Application No. 201510963242, dated May 4, 2017.
SIPO, Decision of Reexamination for CN Application No. 201510963242, dated Feb. 1, 2018.
SIPO, Notification to Grant Patent Right for Invention for CN Application No. 201510963242, dated Jan. 9, 2019.
JPO, Office Action for JP Application No. 2017541007, dated Jul. 23, 2019.
EPO, Office Action for EP Application No. 16874631.1, dated Jun. 19, 2020.
MYIPO, Office Action for MY Application No. PI 2017702798, dated Jun. 2, 2020.

* cited by examiner

IMAGE SENSOR, OUTPUT METHOD, PHASE FOCUSING METHOD, IMAGING DEVICE, AND TERMINAL

CROSS-REFERENCE TO RELATED APPLICATION

This application is a continuation of U.S. application Ser. No. 15/632,697, filed Jun. 26, 2017, which is a continuation of International Application No. PCT/CN2016/101704, filed Oct. 10, 2016, which claims priority to Chinese Patent Application No. 201510963242.5, filed Dec. 18, 2015. The entire disclosures of the aforementioned applications are incorporated herein by reference.

FIELD

The present disclosure relates to image device technologies, and particularly, to a pixel information output method of an image sensor, a phase focusing method, an image sensor, an imaging device, and a terminal.

BACKGROUND

Currently, a pixel structure, in a sensor of a phone camera, includes a micro-lens corresponding to a pixel unit and has two problems. First, the size of the pixel unit of the sensor of the phone camera becomes smaller and smaller, and the imaging sensitivity and the SNR (signal noise ratio) of the sensor need to be improved, this is not benefit for image quality of pictures. Second, the micro-lens receives light in all directions for imaging of the same pixel unit. The pixel unit does not distinguish directions of the received light, so the pixel unit cannot meet a condition of the phase detection and cannot provide a basis for phase focusing.

DETAILED DESCRIPTION

Figure 1:
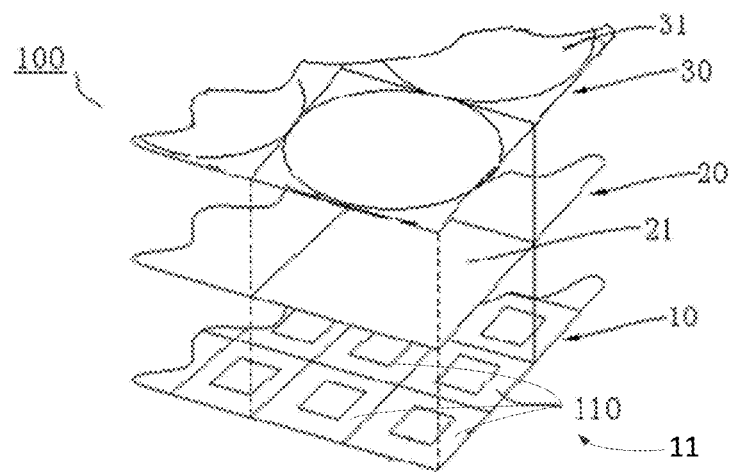
FIG. 1 is a schematic diagram of an image sensor, according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

In order to enhance the imaging sensitivity and the SNR of the phone camera and achieve the phase detection, in embodiments of the present disclosure, a plurality of photosensitive pixels form a group sharing one micro-lens, pixel information of each photosensitive pixel of a group of the photosensitive pixel is respectively read to distinguish imaging light. The plurality of photosensitive pixels can be combined for imaging to reach a higher imaging sensitivity and a higher SNR, and the phase difference information detection function can be achieved through different entrance directions of the light.

FIG. 1 is a schematic diagram of an image sensor, according to an embodiment of the present disclosure. As shown in FIG. 1, the image sensor 100 includes a photosensitive unit array 10, a filter cell array 20, and a micro-lens array 30.

Wherein, the filter cell array 20 is located between the photosensitive unit array 10 and the micro-lens array 30. The photosensitive unit array 10 includes a plurality of photosensitive units 11. The filter cell array 20 includes a plurality of filter cells 21. The micro-lens array 30 includes a plurality of micro-lenses 31. Each micro-lens 31 covers a corresponding filter cell 21 and a corresponding photosensitive unit 11. Each photosensitive unit 11 includes a plurality of photosensitive pixels 110. For example, in one embodiment of the present disclosure, each photosensitive unit 11 includes 2*2 photosensitive pixels 110.

In some embodiments of the present disclosure, the filter cell array 20 includes a Bayer array (Bayer pattern). Using a Bayer structure, traditional algorithms for the Bayer structure can be employed to process image signals so that there is no need to make a major adjustment on hardware structures.

Figure 2:
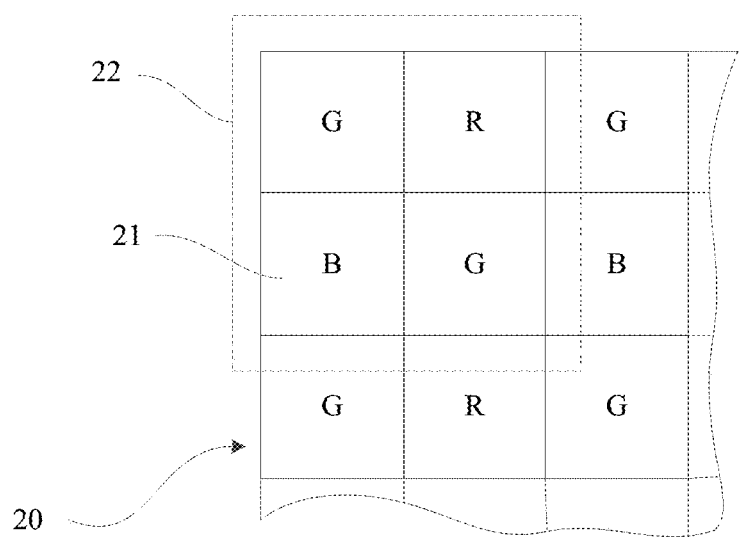
FIG. 2 is a schematic diagram of a filter cell array using a Bayer array, according to an embodiment of the present disclosure.
Figure 3:
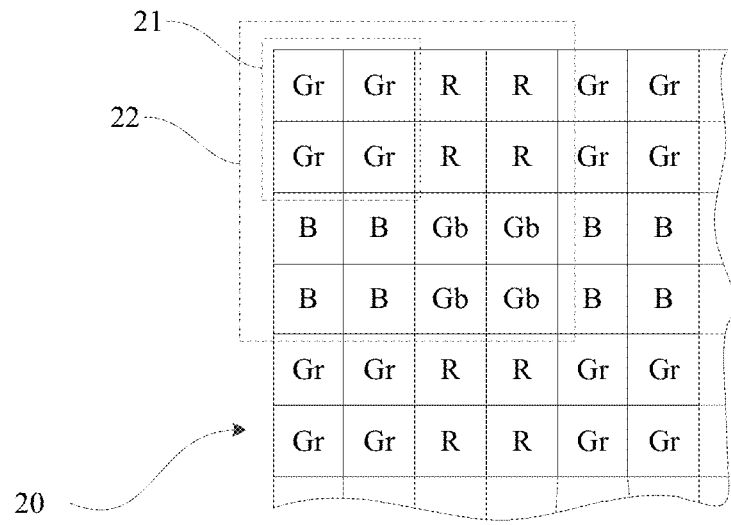
FIG. 3 is a schematic diagram of a filter cell array using a Bayer array, according to an embodiment of the present disclosure.

Referring to FIG. 2 and FIG. 3, in the Bayer structure, 2*2 filter cells 21 form a filter structure 22. The 2*2 filter cells 21 are green, red, blue, and green filter cells 21.

In the structure of a conventional the filter cell array 20, each filter cell 21 corresponds to a photosensitive pixel 110 and an image pixel. In the embodiments of the present disclosure, the filter cell array 20 employs the Bayer structure. The difference is that each filter cell 21 corresponds to a plurality of photosensitive pixels 110, such as four photosensitive pixels 110, which means that the plurality of photosensitive pixels 110 correspond to one filter unit 21 having a same color.

In summary, in the image sensor 100 of the embodiments of the present disclosure, the plurality of photosensitive pixels 110 form a group and share one micro-lens 31. In other words, instead of corresponding to one photosensitive pixel, one micro-lens 31 of the image sensor 100 corresponds to the plurality of photosensitive pixels 110. And the group of the photosensitive pixels 110, that the photosensitive pixels 110 in the photosensitive unit 11, corresponds to the filter cell 21 having the same color.

Figure 4:
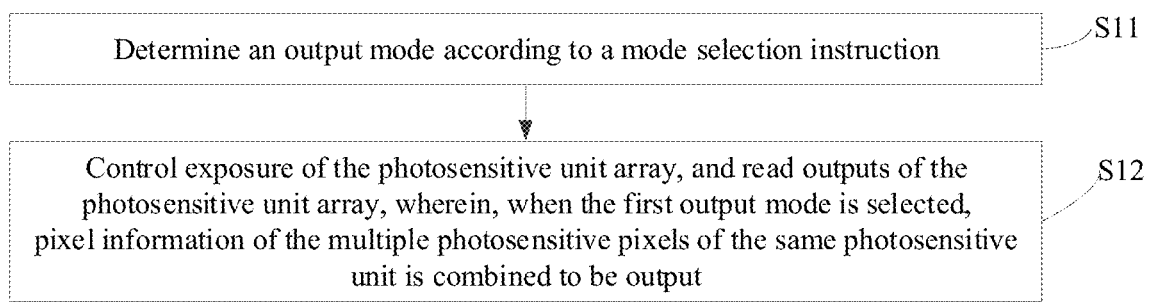
FIG. 4 is a flow chart of a pixel information output method of an image sensor, according to an embodiment of the present disclosure.

Based on the structure of the image sensor 100 shown in FIG. 1, a pixel information output method of the image sensor 100 is explained below. FIG. 4 is a flow chart of a pixel information output method of an image sensor 100, in accordance with one embodiment of the present disclosure. As shown in FIG. 4, the method includes the following steps to:

S1, determine an output mode according to a mode selection instruction.

In the embodiment of the present disclosure, the output mode includes a first output mode and a second output mode. The first output mode can be understood as an output mode for improving the imaging sensitivity and the SNR. The second output mode can be understood as an output mode for the phase focusing and the depth information test.

S2, control exposure of the photosensitive unit array 10, and read outputs of the photosensitive unit array 10. Wherein, pixel information of the plurality of photosensitive pixels 110 of the same photosensitive unit 11 is combined to be output when the first output mode is selected.

Specifically, when the pixel information of the plurality of photosensitive pixels 110 of the photosensitive unit 11 corresponding to the same micro-len 31 is combined to be output, compared with the output signal of one photosensitive pixel corresponding to one micro-lens, the combined output signal of the plurality of photosensitive pixels 110, such as N photosensitive pixels, is improved by N times. Since the noise is proportional to the square root of the signal, that is, noise $\propto (Signal)^{1/2}$, the signal becomes N times than ever, the noise is $N^{1/2}$ times than ever, and both the imaging sensitivity and the SNR of the image have a corresponding improvement.

Figure 5:
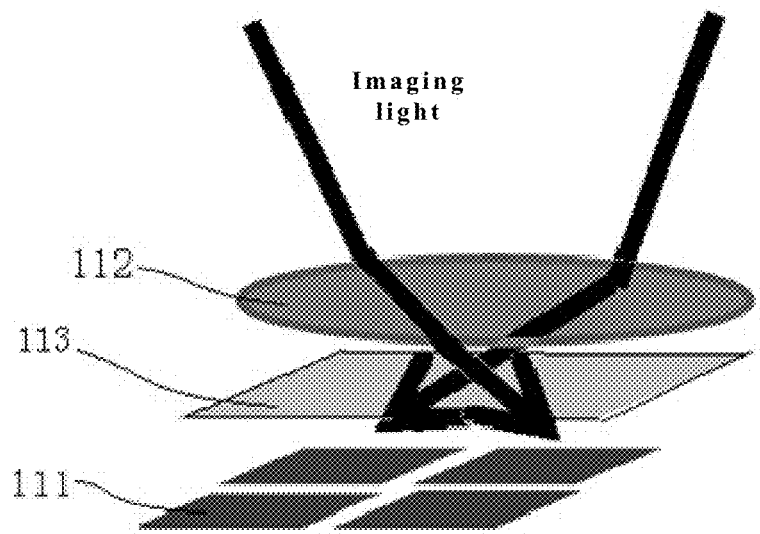
FIG. 5 is a schematic diagram of imaging, according to an embodiment of the present disclosure.
Figure 6:
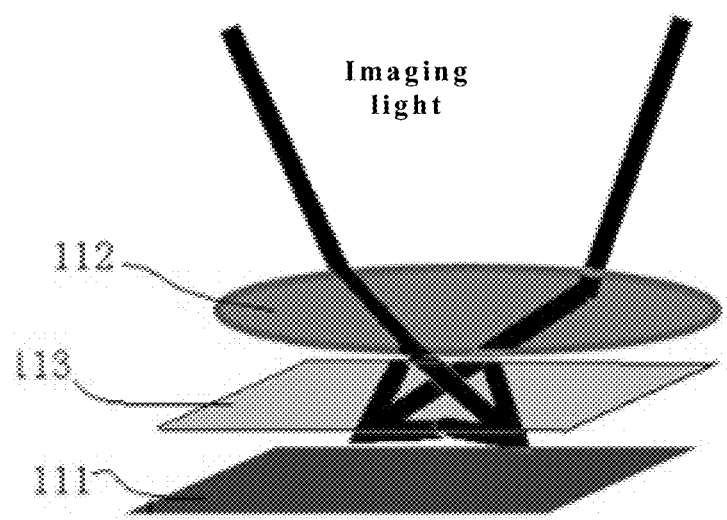
FIG. 6 is a schematic diagram of imaging of the related art.

FIG. 5 is a schematic diagram of imaging light in accordance with one embodiment of the present disclosure. Wherein, one micro-lens 112 corresponds to one filter cell 113 and four photosensitive pixels 111. FIG. 6 is a schematic diagram of imaging light of the related art. Wherein, one micro-lens 112 corresponds to one filter cell 113 and one photosensitive pixel 111. As shown in FIG. 1 and FIG. 5, if the pixel information of the four photosensitive pixels 111 is combined to be output, the signal will becomes 4 times than that of the pixel structure shown in FIG. 6, and noise will be only 2 times than that of the pixel structure shown in FIG. 6, thus both the sensitivity and the SNR of the image have a corresponding improvement.

As can be seen, the pixel information output method of the image sensor 100 of the embodiment of the present disclosure, based on the structure in which one micro-lens 31 corresponds to one filter cell 21 and a plurality of photosensitive pixels 110, makes the pixel information of the plurality of photosensitive pixels 110 of the same photosensitive unit 11 be combined to be output, when the first output mode is selected. Compared with the output of a single photosensitive pixel 111 of the related art, this can improve the imaging sensitivity and the SNR to improve the image quality.

In order to satisfy a condition of the phase detection to realize phase focusing, when the second output mode is selected, the pixel information of the plurality of photosensitive pixels 110 of the same photosensitive unit 11 is controlled to be individually output. And then, the imaging light can be distinguished to obtain the phase difference information of imaging according to the pixel information of the plurality of photosensitive pixels 110 of the photosensitive unit 11, and the phase focusing can be adjusted according to the phase difference information.

Figure 7:
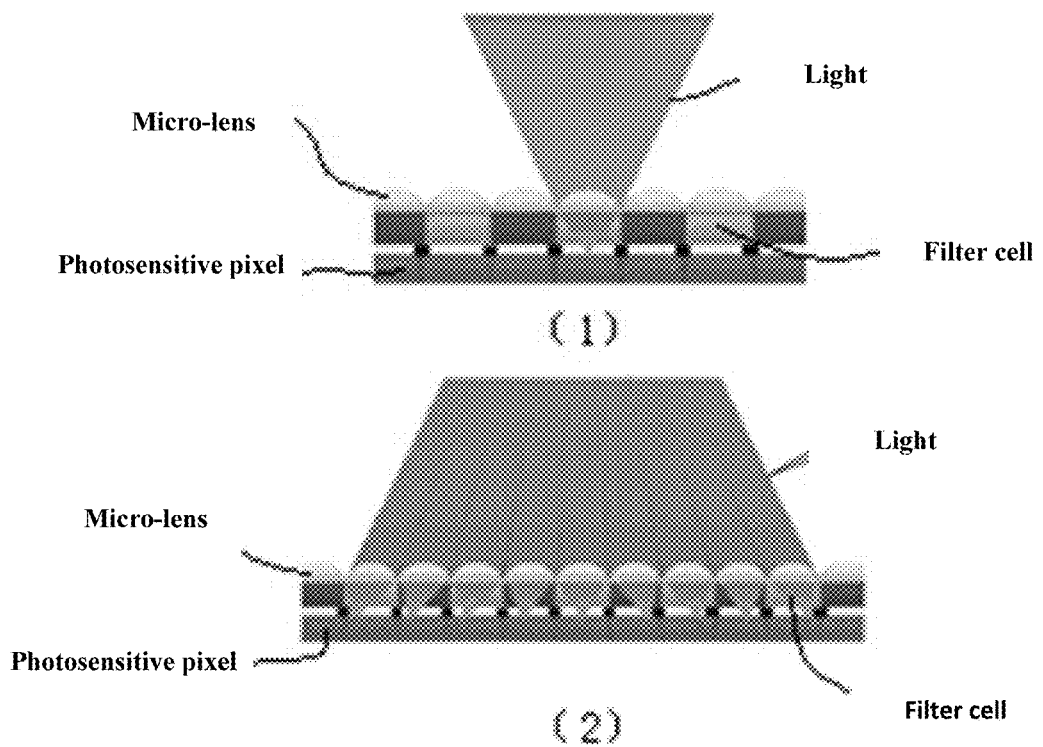
FIGS. 7 (1) and (2) are schematic diagrams, illustrating inputs of the imaging light in the related art.

According to relevant knowledge, for the pixel structure shown in FIG. 6, which one micro-lens 112 corresponds to one filter cell 113 and one photosensitive pixel 111, the imaging light passes through the micro-lens and is then converged on the photosensitive pixel to be imaged, in the case of focus as shown in FIG. 7(1). In the case of defocus, as shown in FIG. 7(2), the imaging light diverges, and each micro-lens receives the divergence light from serveal directions to be imaged by the corresponding photosensitive pixels below. Because the same photosensitive pixel cannot distinguish direction of the received light, the condition of the phase detection can not be met. In the related art, in general, in order to achieve the PDAF (Phase Detection Auto Focus), physical design of pairs of adjacent photosensitive pixels (a.k.a. masked pixels, the masked pixel has a more complicated structure than an ordinary photosensitive pixel. In general, it needs to change the structure of the ordinary photosensitive pixel or increase a light mask on the structure of the ordinary photosensitive pixel alone, so that the light of particular direction, which is in the light from several directions toward the masked pixel, can not reach the photosensitive portion of the masked pixel, and the light except of the particular direction can reach the photosensitive portion of the masked pixel. In other words, the masked pixels are usually arranged in pairs, proximity, and symmetry. The pairs of masked pixels are used to split the light from several directions) in the image sensor is used to split the imaging light, toward the pairs of masked pixels and from several directions, into left and right two parts. The distance, which the camera lens needs to be moved, can be calculated by means of comparing the phase differences (that is, by collecting outputs of the pairs of the masked pixels) after imaging using the light of the left and right parts.

In the embodiment of the present disclosure, based on each micro-lens 31 corresponds to a filter cell 21 and a photosensitive unit 11, and each photosensitive unit 11 includes a plurality of photosensitive pixels 110, that is, each micro-lens 31 corresponds to a plurality of photosensitive pixels 110. Therefore, the light received by each micro-lens 31 is used to be imaged by the plurality of photosensitive pixels 110. The pixel information of the plurality of photosensitive pixels 110 of the same photosensitive unit 11 is controlled to be individually output, so that light signals from several directions can be captured. It can be seen that the above structure plays a role in splitting the imaging light. And then, the imaging light can be identified according to the pixel information output of the plurality of photosensitive pixels 110 of each photosensitive unit 11. The phase difference information of the image can be obtained by comparing the light signals from different directions. Furthermore, the distance of a shooting object is captured according to the phase difference information, and a data basis is provided for the phase focusing and the depth information test. Obviously, in the embodiment of the present disclosure, the phase focusing detection can be achieved only by cooperative design among the micro-lens array 30, the filter cell array 20, and the photosensitive unit array 10. Thus, there is no need to change the structure of the ordinary photosensitive pixel or increase a light mask on the structure of the ordinary photosensitive pixel alone, and the approach to realize the phase focusing detection is easier.

For example, as shown in FIG. 5, when the pixel information of the four photosensitive pixels 111 of each photosensitive unit 11 is respectively read, the light signals from different directions, i.e. up, down, left, right light signals, can be captured according to the pixel information outputs of the four photosensitive pixels 111. The phase difference information of the whole image can be obtained by comparing the light signals from different directions. And then, the phase difference information can be converted into the focusing distance information, and the phase focusing can be achieved by means of adjusting the position of the camera lens in accordance with the focusing distance information.

In summary, the pixel information output method of the image sensor 100 of the embodiment of the present disclosure, based on an arrangement that each micro-lens 31 corresponds to the plurality of photosensitive pixels 110, two work states can be achieved. The first work state is that the pixel information of the plurality of photosensitive pixels 110 of each photosensitive unit 11 is combined to be output to improve the image quality. Another work state is that the pixel information of the plurality of photosensitive pixels 110 of each photosensitive unit 11 is individually output, and the phase difference information can be obtained by comparing the information among the photosensitive pixels 110, thereby providing a data basis for the phase focusing and the depth information test.

A phase focusing method of an embodiment of the present disclosure, of one aspect, is explained below.

Figure 8:
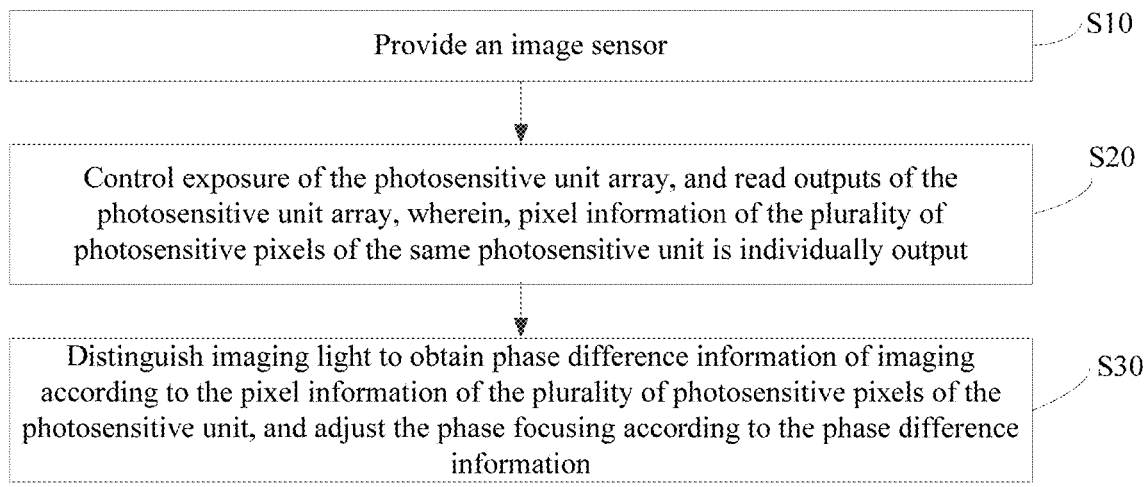
FIG. 8 is a flow chart of a phase focusing method, according to an embodiment of the present disclosure.

FIG. 8 is a flow chart of a phase focusing method, according to an embodiment of the present disclosure. As shown in FIG. 8, the phase focusing method includes the following steps to:

S10, provide an image sensor 100.

The image sensor 100 includes a photosensitive unit array 10, a filter cell array 20, and a micro-lens array 30. The filter cell array 20 is located between the photosensitive unit array 10 and the micro-lens array 30. The photosensitive unit array 10 includes a plurality of photosensitive units 11. The filter cell array 20 includes a plurality of filter cells 21. The micro-lens array 30 includes a plurality of micro-lenses 31. Each micro-lens 31 covers a corresponding filter cell 21 and a corresponding photosensitive unit 11. Each photosensitive unit 11 includes a plurality of photosensitive pixels 110, which means each micro-lens 31 corresponds to a plurality of photosensitive pixels 110.

S20, control exposure of the photosensitive unit array 10, and read outputs of the photosensitive unit array 10. Wherein, pixel information of the plurality of photosensitive pixels 110 of the same photosensitive unit 11 is individually output.

S30, distinguish imaging light to obtain phase difference information of imaging according to the pixel information of the plurality of photosensitive pixels 110 of the photosensitive unit 11, and adjust the phase focusing according to the phase difference information.

The phase focusing method of the present disclosure, based on the structure of the image sensor 100 in which each micro-lens 31 corresponds to one filter cell 21 and a plurality of photosensitive pixels 110, makes the pixel information of the plurality of photosensitive pixels 110 of the same photosensitive unit 11 individually output. In a defocus state, each photosensitive unit 11 can obtain light signals from different directions to provide a condition for the phase focusing, and then the phase difference information can be obtained to realize the phase focusing.

An imaging device 1000 of an embodiment of the present disclosure, of another aspect, is explained below.

Figure 9:
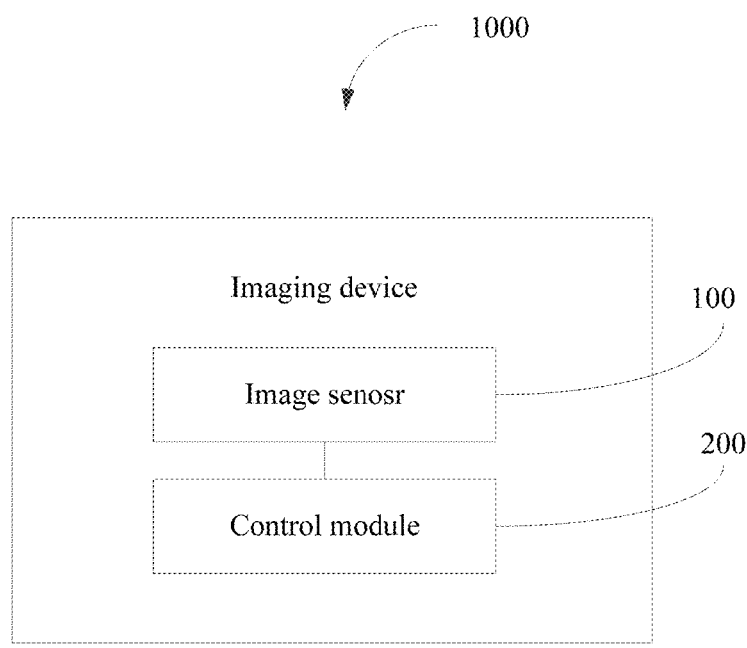
FIG. 9 is a block diagram of an imaging device, according to an embodiment of the present disclosure.

FIG. 9 is a block diagram of an imaging device 1000, according to an embodiment of the present disclosure. As shown in FIG. 9, the imaging device 1000 includes the above-mentioned image sensor 100 and a control module 200.

The control module 200 determines an output mode according to a mode selection instruction, controls the exposure of the photosensitive unit array 10, and outputs of the photosensitive unit array 10 are read. Wherein, when the first output mode is selected, the control module 200 controls the pixel information of the plurality of photosensitive pixels 110 of a same photosensitive unit 11 to be combined to be output.

The imaging device 1000 of the present disclosure, based on the structure of the image sensor 100 in which each micro-lens 31 corresponds to one filter cell 21 and a plurality of photosensitive pixels 110, the control module 200 makes the pixel information of the photosensitive pixels 110 of the same photosensitive unit 11 be combined to be output, when the first output mode is selected. Compared with the output of the single photosensitive pixel 111 of the related art, this can improve the imaging sensitivity and the SNR to improve the image quality.

In the embodiment of the present disclosure, when the second output mode is selected, the control module 200 controls the pixel information of the photosensitive pixels 110 of the same photosensitive unit 11 to be individually output. The control module 200 distinguishes the imaging light to obtain phase difference information of imaging according to the pixel information of the photosensitive pixels 110 of the photosensitive unit 11, and adjusts the phase focusing according to the phase difference information.

Figure 10:
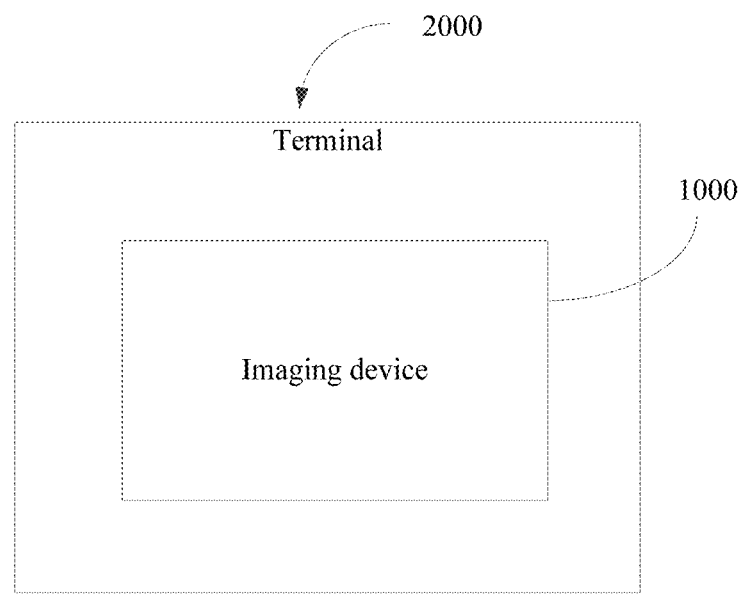
FIG. 10 is a block diagram of a terminal, according to an embodiment of the present disclosure.

A terminal 2000 of an embodiment of the present disclosure, of another aspect, is provided. As shown in FIG. 10, the terminal 2000 includes the imaging device 1000 of the above-mentioned embodiment. The terminal 2000 can take a picture, and have an improving image quality and a phase detection function.

An imaging device 1000 of an embodiment of the present disclosure, of another aspect, is described below referring to the figures. The imaging device 1000 includes an image sensor 100 and a control module 200.

The control module 200 controls the exposure of the photosensitive unit array 10 of the image sensor 100, and the outputs of the photosensitive unit array 10 are read. Wherein, the control module 200 controls the pixel information of the photosensitive pixels 110 of the same photosensitive unit 11 to be individually output, distinguishes the imaging light to obtain phase difference information of imaging according to the pixel information of the plurality of photosensitive pixels 110 of the photosensitive unit 11, and adjusts the phase focusing according to the phase difference information.

The imaging device 1000 of the present disclosure, based on the structure of the image sensor 100 in which each micro-lens 31 corresponds to one filter cell 21 and a plurality of photosensitive pixels 110, the control module 200 makes the pixel information of the photosensitive pixels 110 of the same photosensitive unit 11 be individually output. In a defocus state, each photosensitive unit 11 can obtain light signals from different directions to provide a condition for the phase focusing, and then the phase difference information can be obtained to provide a basis for realizing the phase focusing.

A terminal 2000 of an embodiment of the present disclosure, of another aspect, is described below referring to the figures. The terminal 2000 includes the imaging device 1000 of the above-mentioned embodiment. The terminal 2000 has a phase focusing function.

In detail, the terminal 2000 can include, but is not limited to, cell phones.

The imaging device 1000 can include a front-facing camera(s), obtain focusing distance information according to the phase difference information, and then adjust the distance of the front-facing camera according to the focusing distance information to realize the phase focusing.

Based on the image sensor 100 of the above-mentioned embodiment, wherein the image sensor 100 includes a photosensitive unit array 10, a filter cell array 20, and a micro-lens array 30. The filter cell array 20 is located between the photosensitive unit array 10 and the micro-lens array 30. The photosensitive unit array 10 includes a plurality of photosensitive units 11. The filter cell array 20 includes a plurality of filter cells 21. The micro-lens array 30 includes a plurality of micro-lenses 31. Each micro-lens 31 covers a corresponding filter cell 21 and a corresponding photosensitive unit 11. Each photosensitive unit 11 includes a plurality of photosensitive pixels 110. An imaging method of an embodiment of the present disclosure is described below referring to the figures.

Figure 11:
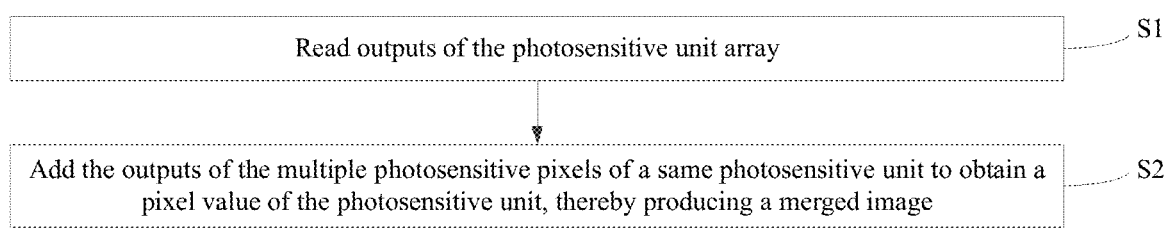
FIG. 11 is a flow chart of an imaging method, according to an embodiment of the present disclosure.

FIG. 11 is a flow chart of an imaging method, according to an embodiment of the present disclosure. As shown in FIG. 11, the imaging method includes the following steps to:

S1, read outputs of the photosensitive unit array 10.

S2, add the outputs of the plurality of photosensitive pixels 110 of a same photosensitive unit 11 to obtain a pixel value of the photosensitive unit 11, thereby producing a merged image.

The imaging method of the embodiment of the present disclosure, assuming the output of each original photosensitive unit 11 is represented as S, the noise is represented as N, the photosensitive unit 11 includes M photosensitive units 11, the pixel value of the photosensitive unit 11 can be represented as n*m*S, and the noise of the photosensitive unit 11 is represented as $$\frac{\sqrt{n*m*N^2}}{n*m}.$$

In a case that n=2, and m=2, the noise of the photosensitive unit 11 is about n*m*N/2. Therefore, the brightness of the photosensitive unit 11 in a low-luminance environment is improved, and the SNR is improved.

Figure 12:
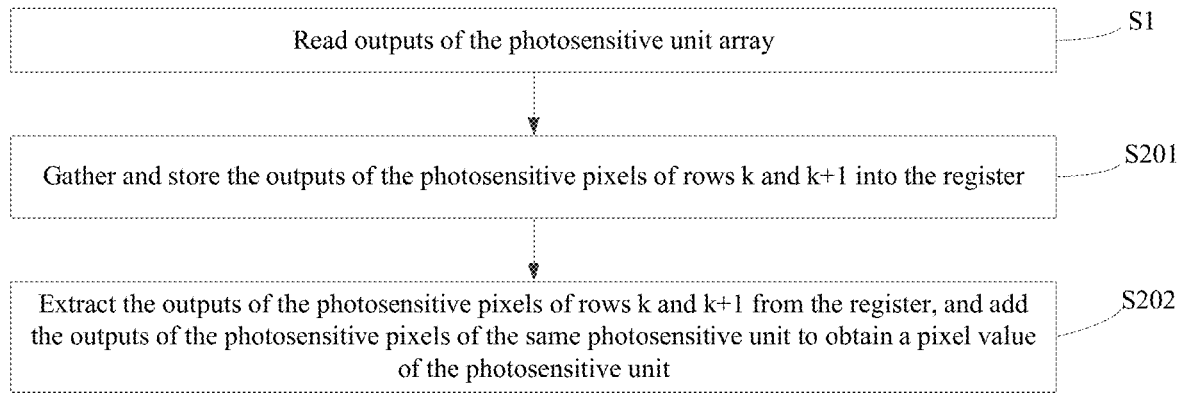
FIG. 12 is a flow chart of an imaging method, according to an embodiment of the present disclosure.

Referring to FIG. 12, in some embodiments, each photosensitive unit 11 includes 2*2 photosensitive pixels 110. The image sensor 100 includes a register, the step of S2 further includes:

S201, gather and store the outputs of the photosensitive pixels 110 of rows k and k+1 into the register, wherein k=2n−1, n is a natural number, k+1 is less than or equal to the total row of the photosensitive pixels 110.

S202, extract the outputs of the photosensitive pixels 110 of rows k and k+1 from the register, and add the outputs of the photosensitive pixels 110 of the same photosensitive unit 11 to obtain a pixel value of the photosensitive unit 11.

Thus, a process of reading, caching, and combining the outputs of the photosensitive pixels 110 can be achieved using the register.

Figure 13:
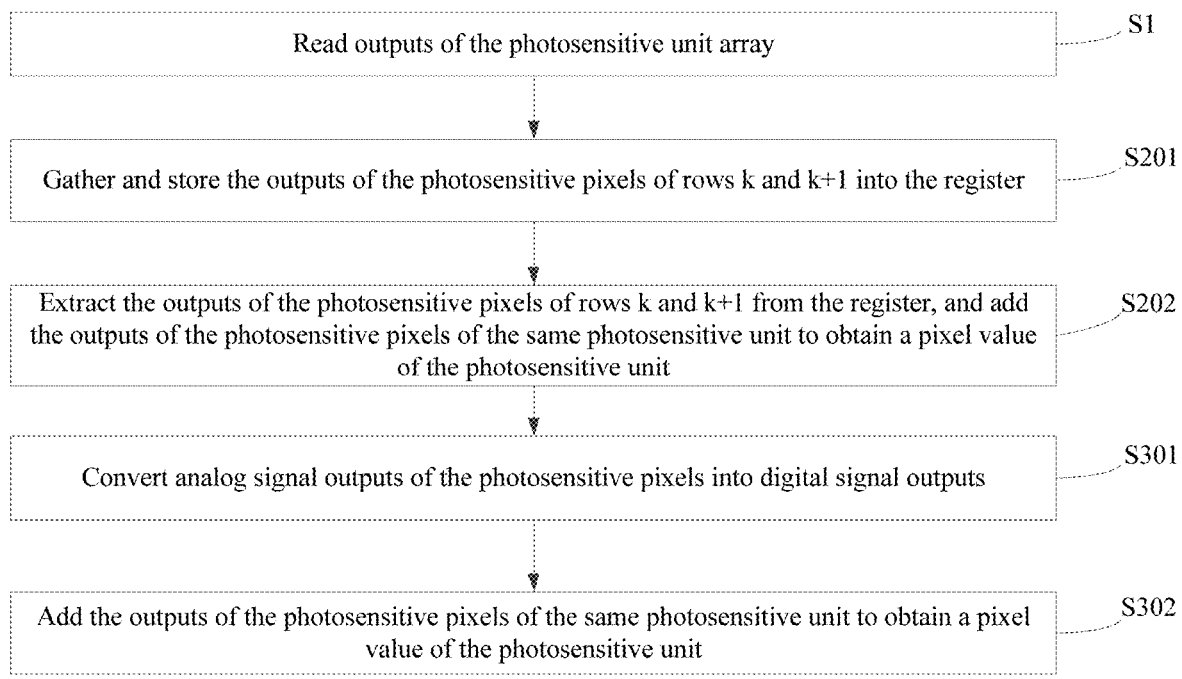
FIG. 13 is a flow chart of an imaging method, according to another embodiment of the present disclosure.

Referring to FIG. 13, in some embodiments, the step of S2 further includes:

S301, convert analog signal outputs of the photosensitive pixels 110 into digital signal outputs; and S302, add the outputs of the photosensitive pixels 110 of the same photosensitive unit 11 to obtain a pixel value of the photosensitive unit 11.

Thus, an image processing module as a digital signal processing chip can directly process outputs of the image sensor, and compared with some solutions of directly processing the outputs of the image sensor with an analog signal format through a circuit, the image information is better reserved. For example, for an image sensor with 16M pixels, the imaging method of the present disclosure can both produce a megered image with 4M pixels (which combines the 2*2 pixels), and produce an original image with 16M pixels (which is not combined).

A mobile terminal 2000 of an embodiment of the present disclosure, in another aspect, is provided. The terminal 2000 includes a housing, a processor, a storage, a circuit board, and a power circuit. Wherein, the circuit board is positioned inside a space surrounded by the housing. The processor and the storage are disposed on the circuit board. The power circuit is configured to supply power for each electric circuit or component of the mobile terminal. The storage is configured to store executable program codes. The processor executes a program corresponding to the executable program codes, by means of reading the executable program codes stored in the storage, for executing the above-mentioned imaging method.

A computer-readable storage medium of an embodiment of the present disclosure is also provided. The computer-readable storage medium includes instructions stored therein. When a processor of the mobile terminal executes the instructions, the mobile terminal executes the imaging method of the embodiments of the present disclosure, as shown in FIG. 11.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

The logic and/or steps described in other manners herein or shown in the flow chart, for example, a particular sequence table of executable instructions for realizing the logical function, may be specifically achieved in any computer-readable storage medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer-readable storage medium" may be any device adaptive for including, storing, communicating, propagating or transferring programs to be used by or in combination with the instruction execution system, device or equipment. More specific examples of the computer-readable storage medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device, and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples. In addition, in the case that it is not contradictory, a person of skilled in the art can combine different embodiments or examples and the features of different embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. A method for outputting pixel information of an image sensor, the image sensor comprising a photosensitive unit array, a filter cell array, and a micro-lens array, the filter cell array located above the photosensitive unit array, the micro-lens array located above the filter cell array, each micro-lens covering a corresponding filter cell and a corresponding photosensitive unit, each photosensitive unit comprising four photosensitive pixels, the method comprising:
    determining an output mode according to a mode selection instruction, wherein the output mode comprises a first output mode and a second output mode, the first output mode is configured to improve an imaging sensitivity and a signal-to-noise ratio, and the second output mode is configured to realize a phase focusing; and
    controlling exposure of the photosensitive unit array, and reading outputs of the photosensitive unit array;
    controlling pixel information of four photosensitive pixels of a same photosensitive unit to be combined to be output when the output mode is the first output mode;
    controlling the pixel information of the four photosensitive pixels of the same photosensitive unit to be individually output when the output mode is the second output mode, distinguishing imaging light according to the pixel information of the four photosensitive pixels of the photosensitive unit to obtain phase difference information for imaging, and adjusting the phase focusing according to the phase difference information;
    gathering and storing the outputs of the photosensitive pixels of rows k and k+1 into a register, wherein k=2n−1, n is a natural number, k+1 is less than or equal to the total row of the photosensitive pixels, each photosensitive unit comprises 2*2 photosensitive pixels, the image sensor comprises the register; and
    extracting the outputs of the photosensitive pixels of rows k and k+1 from the register, and adding the outputs of the photosensitive pixels of the same photosensitive unit to obtain a pixel value of the photosensitive unit.

2. The method of claim 1, comprising:
    converting analog signal outputs of the photosensitive pixels into digital signal outputs.

3. A phase focusing method comprising:
    providing an image sensor, and determining an output mode according to a mode selection instruction, the image sensor comprising a photosensitive unit array, a filter cell array, and a micro-lens array, the filter cell array located above the photosensitive unit array, the micro-lens array located above the filter cell array, each micro-lens covering a corresponding filter cell and a corresponding photosensitive unit, each photosensitive unit comprising four photosensitive pixels, wherein the output mode comprises a first output mode and a second output mode, the first output mode is configured to improve an imaging sensitivity and a signal-to-noise ratio, and the second output mode is configured to realize a phase focusing;
    controlling exposure of the photosensitive unit array and reading outputs of the photosensitive unit array;
    controlling pixel information of photosensitive pixels of a same photosensitive unit to be individually output when the output mode is the second output mode; and
    distinguishing imaging light to obtain phase difference information for imaging according to the pixel information of the photosensitive pixels of the photosensitive unit, and adjusting the phase focusing according to the phase difference information;
    gathering and storing the outputs of the photosensitive pixels of rows k and k+1 into a register, wherein k=2n−1, n is a natural number, k+1 is less than or equal to the total row of the photosensitive pixels, each photosensitive unit comprises 2*2 photosensitive pixels, the image sensor comprises the register; and
    extracting the outputs of the photosensitive pixels of rows k and k+1 from the register, and adding the outputs of the photosensitive pixels of the same photosensitive unit to obtain a pixel value of the photosensitive unit.

4. An imaging device, comprising:
an image sensor comprising:
a photosensitive unit array;
a filter cell array, located above the photosensitive unit array; and a micro-lens array, located above the filter cell array, each micro-lens covering a corresponding filter cell and a corresponding photosensitive unit, each photosensitive unit comprising four photosensitive pixels, and a control module, configured to determine an output mode according to a mode selection instruction, and control exposure of the photosensitive unit array and read outputs of the photosensitive unit array, wherein the output mode comprises a first output mode and a second output mode, the first output mode is configured to improve an imaging sensitivity and a signal-to-noise ratio, and the second output mode is configured to realize a phase focusing, the control module is further configured to control pixel information of four photosensitive pixels of a same photosensitive unit to be combined to be output when the output mode is the first output mode; the control module is further configured to control the pixel information of the four photosensitive pixels of the same photosensitive unit to be individually output when the output mode is the second output mode, distinguish imaging light according to the pixel information of the four photosensitive pixels of the photosensitive unit to obtain phase difference information for imaging, and adjust the phase focusing according to the phase difference information, wherein each photosensitive unit comprises 2*2 photosensitive pixels, the image sensor comprises a register, and the control module is configured to:

gather and store the outputs of the photosensitive pixels of rows k and k+1 into the register, wherein k=2n−1, n is a natural number, k+1 is less than or equal to the total row of the photosensitive pixels; and extract the outputs of the photosensitive pixels of rows k and k+1 from the register, and add the outputs of the photosensitive pixels of the same photosensitive unit to obtain a pixel value of the photosensitive unit.

5. The imaging device of claim 4, wherein each photosensitive unit comprises 2*2 photosensitive pixels.

6. The imaging device of claim 4, wherein the filter cell array comprises a Bayer array.

7. The imaging device of claim 4, wherein the control module is configured to:

convert analog signal outputs of the photosensitive pixels into digital signal outputs.

* * * * *